United States Patent [19]

Bauer

[11] Patent Number: 5,144,400
[45] Date of Patent: Sep. 1, 1992

[54] POWER SEMICONDUCTOR DEVICE WITH SWITCH-OFF FACILITY

[75] Inventor: Friedhelm Bauer, Baden, Switzerland

[73] Assignee: ASEA Brown Boveri Ltd., Baden, Switzerland

[21] Appl. No.: 649,068

[22] Filed: Feb. 1, 1991

[30] Foreign Application Priority Data

Feb. 13, 1990 [CH] Switzerland .................. 461/90-0

[51] Int. Cl.[5] .................. H01L 29/74; H01L 29/747; H01L 29/10; H01L 29/48
[52] U.S. Cl. .................. 357/38; 357/37; 357/39; 357/23.4; 357/15
[58] Field of Search .................. 357/37, 38, 39, 23.4, 357/15

[56] References Cited

U.S. PATENT DOCUMENTS

| | | | |
|---|---|---|---|
| 3,427,511 | 2/1969 | Rosenzweig | 357/38 |
| 4,717,940 | 1/1988 | Shinohe et al. | 357/23.4 |
| 4,760,431 | 7/1988 | Nakagawa et al. | 357/38 |
| 4,954,869 | 9/1990 | Bauer | 357/38 |
| 5,016,066 | 5/1991 | Takahashi | 357/23.4 |

FOREIGN PATENT DOCUMENTS 0064613 11/1982 European Pat. Off. .

OTHER PUBLICATIONS

International Electron Devices Meeting, Dec. 1-4, 1985, pp. 158-161, M. Stoisiek, et al., "MOS GTO-A Turn Off Thyristor with MOS-Controlled Emitter Shorts".

Patent Abstracts of Japan, vol. 13, No. 150 (E-742) (3498), Apr. 12, 1989, and JP-A-63-310171, Dec. 19, 1988, M. Mori, "Composite Semiconductor Device".

Earlier Swiss Patent Application, CH-2945/89-4, Aug. 10, 1989.

*Primary Examiner*—Rolf Hille
*Assistant Examiner*—Wael Fahmy
*Attorney, Agent, or Firm*—Oblon, Spivak, McClelland, Maier & Neustadt

[57] ABSTRACT

In an MOS-controlled power semiconductor device with switch-off facility having a thyristor-like structure, the switch-off capability is improved by inserting emitter ballast resistors between the first main electrode (H1) and the associated emitter region (8). For this purpose, the emitter region (8) is of annular or strip-like construction and encloses a more weakly doped central region (9) which is exclusively contacted by the first main-electrode metallization (2).

7 Claims, 2 Drawing Sheets

POWER SEMICONDUCTOR DEVICE WITH SWITCH-OFF FACILITY

BACKGROUND OF THE INVENTION

1. Field of the Invention

The present invention relates to the field of power electronics. It relates, in particular, to a power semiconductor device with switch-off facility, comprising
  (a) a multiplicity of first unit cells disposed next to one another and connected in parallel inside a semiconductor substrate between a first main electrode and a second main electrode;
  (b) a sequence of differently doped layers inside each of the first unit cells, which sequence includes, starting from the side of the second main electrode, an emitter layer, a first base layer oppositely doped to the emitter layer, a second base layer oppositely doped to the first base layer and an emitter region oppositely doped to the second base layer, embedded in the second base layer and connected to a first main-electrode metallization, and which sequence forms a thyristor structure; and
  (c) at least one emitter ballast resistor inside each of the first unit cells, which emitter ballast resistor is inserted into the connection between the emitter region and the first main-electrode metallization.

Such a device is known, for example, from DE-A13,802,050.

DISCUSSION OF BACKGROUND

The gate-turn-off thyristor (GTO) is at present the "work horse" in all the demanding applications of modern power electronics in which a semiconductor device with switch-off facility is required. However, the GTO is still far from being an ideal switch.

Its reliable operation requires, for example, complex and, consequently, space-consuming and expensive triggering systems and protective designs. A particular problem is the switching of the device from a high-current-density operating state to a new one with high blocking voltage.

In this situation, the phenomenon of current filamenting is observed. This is understood as meaning the development of inhomogeneities in the distribution of current density with respect to area during the switch-off process. Without suitable protective measures, these may assume such a level that the device is damaged or completely destroyed by the excessive Joule heat produced.

In order to prevent precisely this, complex and, depending on the power class, also very bulky protective circuits which limit the voltage rise across the device during the switching-off to such an extent that the undesirable effects are certain not to occur are provided in the switching circuits.

In addition to the GTOs, the MOS-controlled thyristors (MCTs) have furthermore received considerable attention in power electronics (in this connection, see, for example, the paper by M. Stoisiek and H. Strack, IEDM Technical Digest, pages 158-161, 1985). They are at present regarded as potential successors to the GTOs.

Like the GTOs, the MCTs have a true thyristor structure. In their case, too, the possibility cannot be ruled out a priori that, as already described above in connection with the GTO, the development of current filaments may occur during switching-off.

It is now known that so-called emitter ballast resistors may be disposed between the actual $n^+$-type emitter and the cathode metallization in order to homogenize an inhomogeneous current density distribution already present in the device, i.e. to prevent a current filament being produced therefrom with catastrophic consequences.

In a practical realization, a ballast resistor is assigned to every emitter finger, i.e. to each of the many elementary thyristors. If a current filament—or an increase in the current density—then occurs at one finger, the voltage drop across the ballast resistor increases locally at that point. An imbalance of potential which prevents the current filament produced increasing in current density is consequently produced inside the p-base layer.

Such ballast resistors have been proposed for the GTO in the publication mentioned initially. They are realized therein as comparatively high-resistance layers which are inserted between the $n^+$-type emitters and the cathode metallization. The layers may in that case be composed, for example, of lightly doped polysilicon.

Such ballast resistors in the form of resistor layers have, however, an important disadvantage: it is a problem to deposit sufficiently thick layers on the substrate for correctly dimensioned resistors.

SUMMARY OF THE INVENTION

Accordingly, one object of this invention is to provide a power semiconductor device with switch-off facility having emitter ballast resistors which avoids the disadvantages of the known devices.

The object is achieved in a device of the type mentioned initially, wherein
  (d) the emitter region is of annular or strip-like construction and encloses a central region which is doped in the same sense, but more lightly; and
  (e) the central region is inserted into the connection between the emitter region and the first main-electrode metallization and acts as emitter balance resistor.

The integration of the ballast resistor into the semiconductor substrate achieves, on the one hand, a more homogeneous resistance distribution; on the other hand, the production of the device is simplified.

A first exemplary embodiment is distinguished by the fact that the device has the structure of an MOS-controlled thyristor MCT.

A further exemplary embodiment is one wherein
  (a) a multiplicity of second unit cells is provided inside the semiconductor substrate between the first main electrode and the second main electrode;
  (b) the first and second unit cells are disposed alternately next to one another and connected in parallel;
  (c) each of the second unit cells comprises the emitter layer, the first base layer and a contact region let into the first base layer on the side of the first main electrode and oppositely doped to the first base layer;
  (d) the second base layer and, adjacently thereto and between the unit cells, the first base layer emerge at the surface of the semiconductor substrate lying on the side of the first main electrode outside the emitter region; and (e) an insulated gate electrode is disposed in this region above the semiconductor substrate on the side of the first main electrode.

Further exemplary embodiments emerge from the subordinate claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
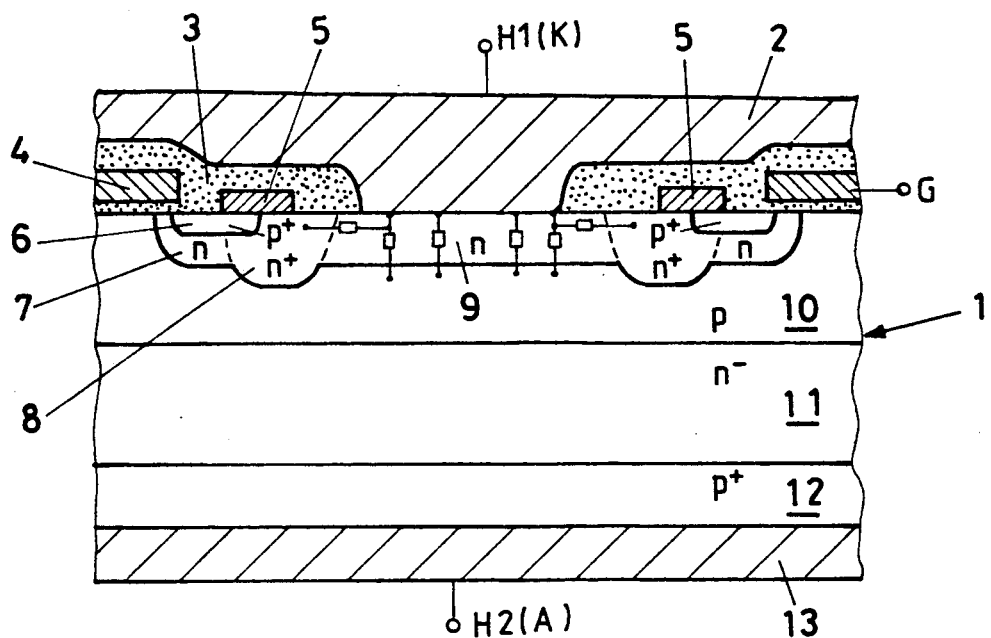
FIG. 1 shows a first exemplary embodiment of the invention in the form of a p-channel MCT having an annular emitter region and a simple central region.

Referring now to the drawings, wherein like reference numerals designate identical or corresponding parts throughout the several views, FIG. 1 shows a first exemplary embodiment of the device according to the invention in the form of a p-channel MCT. A sequence of continuous, differently doped layers which comprise a p$^+$-doped emitter layer 12, an n$^-$-doped first base layer 11 and a p-doped second base layer 10 is disposed in a semiconductor substrate 1 between a first main electrode H1 (which serves, in this case, as cathode K) and a second main electrode H2 (which serves, in this case, as anode A).

The device is laterally subdivided into a multiplicity of similar first unit cells which are disposed next to one another and connected in parallel. One of these first unit cells is shown in FIG. 1. The unit cell may have a square, rectangular or hexagonal base shape. It may, however, also be constructed in the form of an elongated strip.

Each of the first unit cells includes, on the cathode side, an annular or strip-like, n$^+$-doped emitter region 8 which matches the cell base shape and which is let into the second base layer 10. Adjacent to the outside edge of the emitter region 8 are 1, MOS-controlled short circuits which comprise a p$^+$-doped source region 6, an n-doped channel region 7, a gate electrode 4 disposed in an insulated manner above the channel region 7 and a first short-circuit metallization 5.

Suitable biasing at the gate electrode 4 or the gate G connected thereto produces, in the channel region 7, a p-channel which connects the second base layer 10 to the source region 6 in a conducting manner. Since the source region 6 is directly connected in its turn to the neighboring emitter region 8 via the first short-circuit metallization 5, a short circuit is developed, in this case, between the second base layer 10 and the emitter region 8.

Just like the first short-circuit metallization 5, the gate electrode 4 is surrounded by a gate insulation 3 and spanned by a first main-electrode metallization 2 which is connected to the cathode K or the first main electrode H1 On the anode side, a second main-electrode metallization 13 is provided which is connected to the anode A or the second main electrode H2.

Whereas the first main-electrode metallization 2 makes contact directly with the cathode-side emitter region in the conventional p-channel MCT (see the paper by M. Stoisiek and H. Strack cited initially), this takes place indirectly in the exemplary embodiment of FIG. 1 via an interposed n-doped central region 9 which is enclosed by the annular or strip-like emitter region 8.

It is only to this central region 9 that contact is made by the first main-electrode metallization 2 and, because of its relatively light doping, it forms a spatially distributed, integrated emitter ballast resistor which is connected between the emitter region 8 and the first main-electrode metallization 2 (indicated in FIG. 1 by the resistor symbols shown).

Taken by itself, the design of the emitter region in annular or strip form already increases the switch-off capability of the MCT since it counteracts the current concentration in the inner region of the unit cell. Its interaction with the integrated ballast resistors increases this protection against current filamenting still further.

The combination of annular or strip emitter and integrated ballast resistor can be realized in a particularly simple and elegant manner in the case of a p-channel MCT: if the channel regions 7 are introduced into the semiconductor substrate 1 as part of an n-doped region extending over the entire unit cell, an n-doped region which can be used as central region 9 is available from the outset in the interior of the emitter region. The bulk resistances of the central region 9 assume the function of emitter ballast resistors if the emitter region 8 is excluded, as shown in FIG. 1, from being contacted by the first mainelectrode metallization 2.

In this connection, it should be noted, however, that the source region 6 of the emitter short circuit and the emitter region 8 should be short-circuited very efficiently, i.e. by a metal layer (of aluminum or a metal silicide), namely the short-circuit metallization 5. To realize this structure, a two-layer metallization is therefore required.

At this point it should furthermore be noted that, in the device according to FIG. 1, anode short circuits (in the form of local n$^+$-type regions incorporated in the emitter layer 12) or an n-doped stop layer can also be additionally provided on the anode side, as is known in principle from the prior art.

In the exemplary embodiment of FIG. 1, the first main-electrode metallization 2 lies directly on the comparatively lightly n-doped central region 9. There is therefore the risk of a non-ohmic current-voltage characteristic of this contact. If this should impair the operation of the device, a remedy can be provided by the surface of the semiconductor substrate 1 being more heavily n-doped on this side inside the contact hole (FIG. 2).

However, it is then necessary to dispose, inside the n$^+$-doped contact region 14 thus produced, shorts in the form of p$^+$-doped short-circuit regions 15 which prevent a parasitic action of the contact region as emitter.

Figure 2:
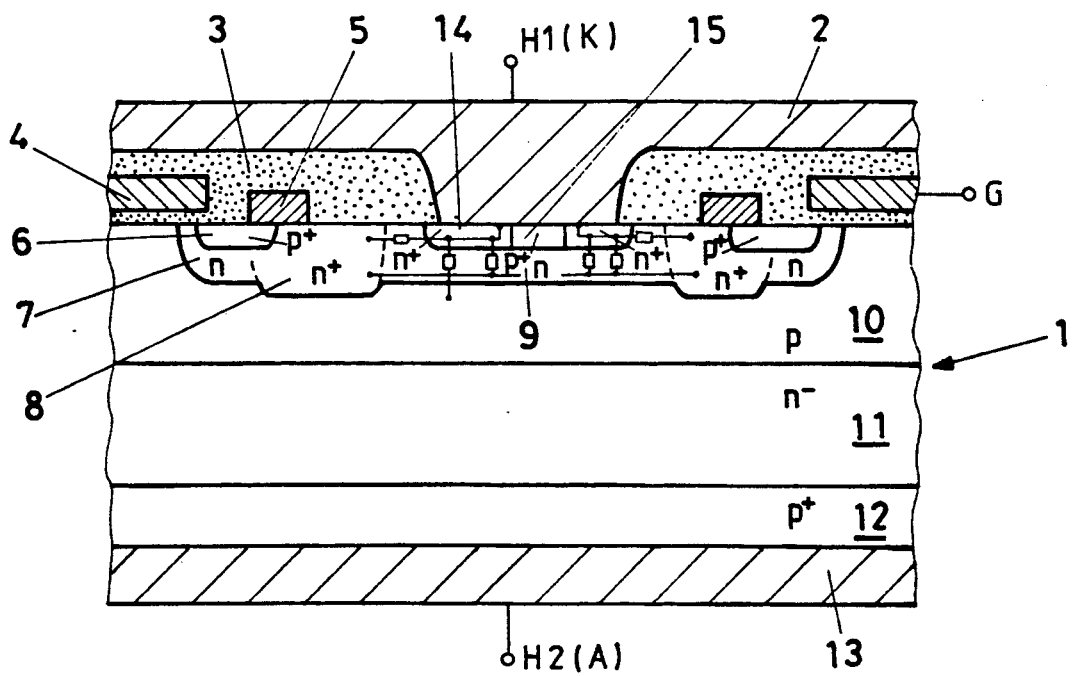
FIG. 2 shows a second exemplary embodiment derived from FIG. 1 and having an additional contact region and short-circuit region inside the central region.

Whereas the exemplary embodiments of FIGS. 1 and 2 hitherto explained related to a p-channel MCT, it is equally conceivable to apply the invention in an n-channel MCT having an integrated electron-hole exchange mechanism and known per se. An example of such an n-channel MCT having integrated emitter ballast resistors is shown in FIG. 3.

The structure and doping of the emitter region 8 and of the central region 9 encompassed by the emitter region 8, and also the contacting of the central region 9 by the first main-electrode metallization 2 are implemented in the same way as in the case of the p-channel MCT of FIG. 1. As in the case of the p-channel MCT of FIG. 2, the contacting of the central region 9 can also be correspondingly modified in the case of the n-channel MCT by introducing a more heavily doped contact region (comparable with the regions 14, 15 in FIG. 2) penetrated by short-circuit regions.

Figure 3:
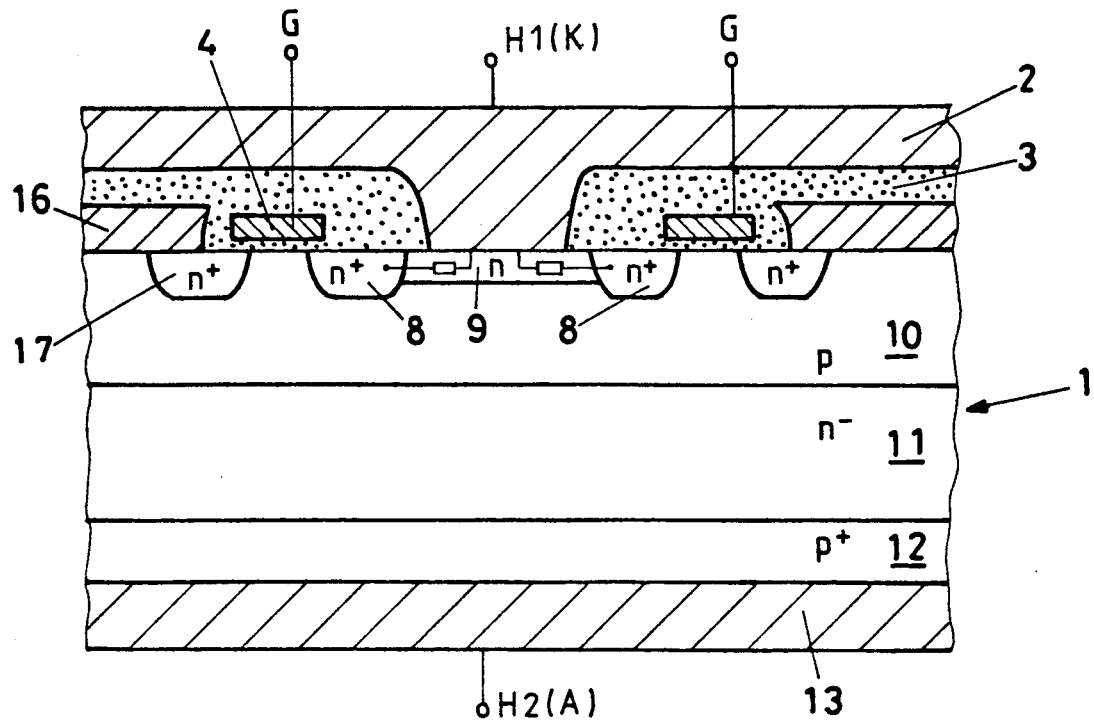
FIG. 3 shows a third exemplary embodiment in the form of an n-channel MCT.

In the device of FIG. 3, the MOS-controlled short circuits are formed in a known manner by the emitter region 8, the second base layer 10 emerging at the surface, an external, n+-doped drain region 17 and the gate electrode 4 disposed above the second base layer 10. Here again a short-circuit metallization 16 is provided which connects the drain region 17 directly to the second base layer 10 and effects the electron-hole exchange.

However, the n-channel MCT of FIG. 3 can also be extended on the anode side by anode short circuits or a stop layer, as has already been mentioned above in connection with the p-channel MCTs of FIGS. 1 and 2.

Figure 4:
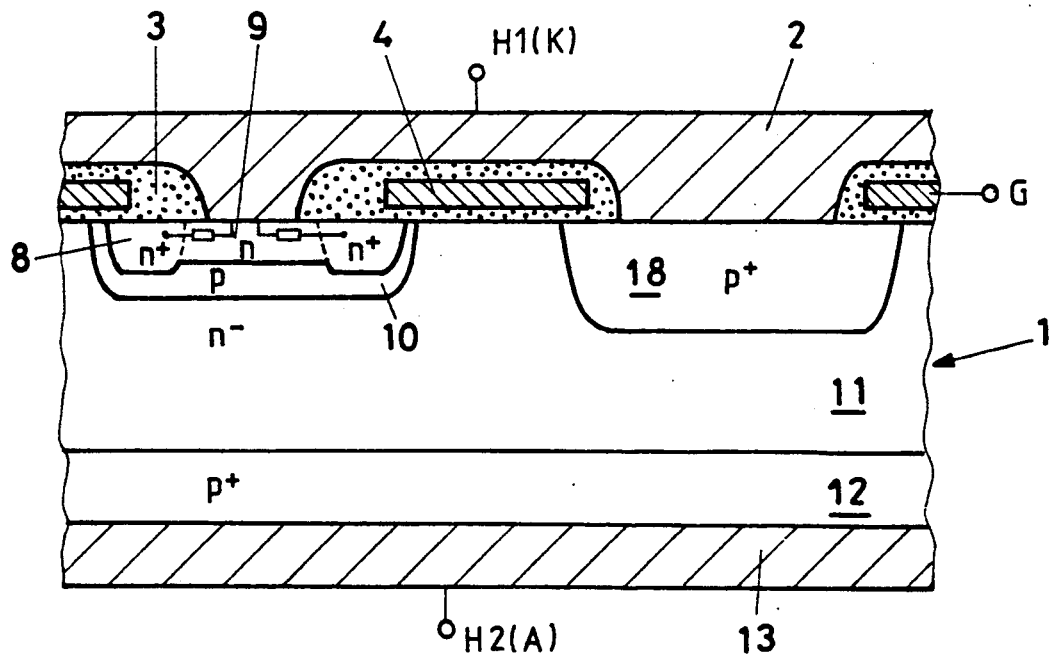
FIG. 4 shows a further exemplary embodiment having two alternately disposed, different unit cells.

The emitter ballast resistors according to the invention can advantageously be used not only—as described hitherto—in the conventional MCTs (p-channel or n-channel), but also in an MOS-controlled device having a novel structure which is the subject of the earlier Swiss Patent application CH-2945/89-4 dated Aug. 10, 1989 and which forms the basis of the exemplary embodiment of FIG. 4.

This device is distinguished by the fact that
 (a) a multiplicity of second unit cells is provided inside the semiconductor substrate 1 between the first main electrode H1 and the second main electrode H2;
 (b) the first and second unit cells are disposed alternately next to one another and connected in parallel;
 (c) each of the second unit cells comprises the emitter layer 12, the first base layer 11 and a contact region 18 let into the first base layer 11 on the side of the first main electrode H1 and oppositely doped to the first base layer 11;
 (d) the second base layer 10 and, adjacently thereto and between the unit cells, the first base layer 11 emerge at the surface of the semiconductor substrate 1 lying on the side of the first main electrode H1 outside the emitter region; and
 (e) an insulated gate electrode 4 is disposed in this region above the semiconductor substrate 1 on the side of the first main electrode H1.

In the exemplary embodiment of FIG. 4, the emitter layer 12 is p+-doped, the first base layer 11 n−-doped, the second base layer 10 p-doped, the emitter region 8 n+-doped, the contact region 18 p+-doped and the central region 9 n-doped.

The doping of the second base layer 10, which corresponds to the p-base of a normal thyristor, must be so chosen that a reliable blocking of the device is ensured. For this purpose, the space charge zone must not extend through the second base layer 10 to the emitter region 8 (punch through).

The doping must furthermore be so chosen that an n-channel can be produced by applying typical gate voltages at the surface of the semiconductor substrate 1 along the periphery of the first unit cell (in the second base layer 10).

Every second unit cell is separated from the respectively neighboring first unit cell by the lightly doped first base layer 11. The surface regions of the first base layer 11 between the unit cells can be inverted (formation of a p-channel) by a suitable negative gate potential.

To explain the operation of the device shown in FIG. 4, let it first be assumed that the device is in the OFF state. If the gate voltage on gate G (or the gate electrode 4) is increased from 0 to positive values (which are above the threshold voltage associated with the n-channel in the second base layer 10), electrons flow from the emitter region 8 through the n-channel into the first base layer 11.

If the diffusion profile for the second base layer 10 is suitably designed, the gain of the associated n-p-n bipolar transistor is sufficiently high, with the result that the four-layer structure in the first unit cell is able to latch up as in a thyristor and to assume a very low resistance as a consequence of charge carrier flooding (in contrast to the structure of a typical IGBT, the latch-up is desirable in this case since a low-resistance state of the device is thus achieved).

To switch off the device, a negative potential (relative to the cathode K) is applied to the same gate electrode 4; it should be greater in magnitude than the threshold voltage which is associated with the p-channels between the unit cells. Under these conditions, the n-channels no longer exist in the regions of the second base layer 10 near the surface.

Of course, the emitter regions 8 of the first unit cells emit since the thyristor structure is, after all, switched on. As a result of switching on the p-channel in the first base layer 11 below the gate electrodes 4, the second base layer 10 and the second unit cells are coupled in terms of potential.

As a result of coupling the first and second unit cells via a low-resistance p-channel, the second base layer 10 is virtually short-circuited to the emitter region 8 via the contact region 18. A large number of holes can now be drained directly from the second base layer 10 via the p-channels and the second unit cells without flowing via the emitter region 8.

As a result of these holes being drained off, the switched-on thyristor structure of the first unit cells cannot continue to maintain its ON state: the entire device switches to the OFF state.

Emitter region 8, central region 9 and the contacting of the central region 9 by the first main-electrode metallization 2 are again implemented in this device in the same way as in the MCTs of FIGS. 1 and 3. Here, too, the modification of the contact according to FIG. 2 can again be provided correspondingly.

Finally, it may furthermore be pointed out that, instead of the doping sequences chosen in the exemplary embodiments, the doping sequences inverse thereto can also be used in each case.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by letters patent of the United States is:

1. A power semiconductor device comprising (a) a multiplicity of first unit cells disposed next to one another and connected in parallel inside a semiconductor substrate between a first main electrode and a second main electrode;

(b) a sequence of differently doped layers inside each of the first unit cells, which sequence includes, starting from the side of the second main electrode, an emitter layer, a first base layer oppositely doped to the emitter layer, a second base layer oppositely doped to the first base layer and an emitter region oppositely doped to the second base layer, embedded in the second base layer and connected to a first main-electrode metallization, and which sequence forms a thyristor structure; and (c) at least one emitter ballast resistor inside each of the first unit cells, which emitter ballast resistor is inserted into the connection between the emitter region and the first main-electrode metallization, wherein (d) the emitter region is of annular or strip-like construction and encloses a central region which is doped in the same sense, but more lightly;

(e) the central region is inserted into the connection between the emitter region and the first-main-electrode metallization and acts as an emitter ballast resistor;

(f) a contact region which is doped in the same sense, but more heavily and which is connected directly to the first main-electrode metallization is let into the central region; and (g) said contact region is interrupted in the interior by at least one oppositely and heavily doped short-circuit region which connects the first main-electrode metallization disposed above the contact region to the central region disposed below the contact region.

2. A device as claimed in claim 1, which has the structure of an MOS-controlled thyristor.

3. The device as claimed in claim 2, wherein (a) the emitter layer is $p^+$-doped, the first base layer $n^-$-doped, the second base layer p-doped, the emitter region $n^+$-doped and the central region n-doped; and (b) the first main electrode forms the cathode and the second main electrode the anode.

4. The device as claimed in claim 3, wherein there are disposed on the cathode side MOS-controlled emitter short circuits in the form of p-channel MOSFETs which are formed from the emitter region, an n-doped channel region outwardly adjoining the emitter region, a $p^+$-doped source region embedded in the channel region and connected too the emitter region via a first short-circuit metallization, and a gate electrode disposed in an insulated manner above the channel region.

5. The device as claimed in claim 3, wherein there are disposed on the cathode side MOS-controlled emitter short circuits in the form of n-channel MOSFETs which are formed from the emitter region, and $n^+$-doped drain region embedded in the second base layer outside the emitter region and connected to the second base layer via a second short-circuit metallization, the second base layer emerging at the cathode-side surface of the semiconductor substrate between emitter region and drain region, and a gate electrode disposed in this region in an insulated manner above the second base layer.

6. A device as claimed in claim 1, wherein (a) a multiplicity of secondary unit cells is provided inside the semiconductor substrate between the first main electrode and the second main electrode;

(b) the first and second unit cells are disposed alternately next to one another and connected in parallel;

(c) each of the second unit cells comprises the emitter layer, the first base layer and a contact region let into the first base layer on the side of the first main electrode and oppositely doped to the first base layer;

(d) the second base layer and, adjacently thereto and between the unit cells, the first base layer emerge at the surface of the semiconductor substrate lying on the side of the first main electrode outside the emitter region; and (e) an insulated gate electrode is disposed in this region above the semiconductor substrate on the side of the first main electrode.

7. The device as claimed in claim 6, wherein (a) the emitter layer is $p^+$-doped, the first base layer $n^-$-doped, the second base layer p-doped, the emitter region $n^+$-doped, the contact region $p^+$-doped and the central region n-doped; and (b) the first main electrode forms the cathode and the second main electrode the anode.

* * * * *